United States Patent [19]

Eisele et al.

[11] Patent Number: 5,105,104
[45] Date of Patent: Apr. 14, 1992

[54] SELF-ADJUSTING PRECHARGE LEVEL CIRCUIT

[75] Inventors: Renny L. Eisele, Manachaca; Kirk N. Holden; B. Chris DeWitt, both of Austin, all of Tex.

[73] Assignee: Motorola, Inc., Schaumburg, Ill.

[21] Appl. No.: 508,443

[22] Filed: Apr. 13, 1990

[51] Int. Cl.⁵ .................... H03K 19/017; H03K 5/153
[52] U.S. Cl. .................... 307/448; 307/451; 307/481; 307/354; 307/358; 307/585
[58] Field of Search ............ 307/443, 451, 480–481, 307/354, 358, 264, 584–585

[56] References Cited

U.S. PATENT DOCUMENTS

| | | | |
|---|---|---|---|
| 4,763,023 | 8/1988 | Spence | 307/480 |
| 4,857,764 | 8/1989 | Young | 307/481 |
| 4,880,997 | 11/1989 | Steele | 307/451 |

Primary Examiner—John S. Heyman
Assistant Examiner—Margaret Rose Wambach
Attorney, Agent, or Firm—Paul J. Polansky

[57] ABSTRACT

A self-adjusting precharge level circuit for coupling to an N-channel precharged bus line. The precharge circuit comprises first, second, and third N-channel transistors and first and second inverters. The first transistor couples the bus line to a positive power supply voltage terminal during a precharge period when the voltage on the bus line falls below the positive power supply voltage minus an N-channel MOS transistor threshold. The second and third transistors together couple the bus line to a second power supply voltage terminal during the precharge period when the voltage level of the bus line rises above positive power supply voltage minus the N-channel MOS thereold, after the voltage level is sensed by the first and second inverters. Sensing and adjusting the voltage in this manner allows the circuit to maintain an N-channel precharge level on a bus which has circuits driving CMOS levels coupled to it, while dampening the voltage response and suppressing oscillation.

4 Claims, 1 Drawing Sheet

: : 5,105,104

SELF-ADJUSTING PRECHARGE LEVEL CIRCUIT

FIELD OF THE INVENTION

This invention relates generally to precharge circuits, and more particularly, to circuits for precharging buses to a predetermined voltage.

BACKGROUND OF THE INVENTION

An integrated circuit often uses a bus to route groups of signals between different parts of the integrated circuit. The bus comprises several signal lines made of a low-impedance conductor, typically metal, and couples to a plurality of circuits for receiving signals therefrom or providing signals thereto. Buses are used in microprocessor integrated circuits to internally route address and data signals between blocks. For example, in response to an instruction, a microprocessor data register couples its contents onto a data bus and the data is received from the bus by an arithmetic logic unit.

In order to optimize the speed of the integrated circuit, it is generally necessary to preset or precharge the voltage level on the bus prior to the data transfer. In a simple form, single transistors made conductive by a precharge control signal couple corresponding bus lines to a predetermined voltage, for instance a positive power supply voltage. Several different precharge schemes are possible, depending on the electrical characteristics of the bus and the integrated circuit technology available, and the precharge voltage is chosen to increase speed and reduce power consumption. For example, a complementary metal-oxide-semiconductor (CMOS) microprocessor with long and highly capacitive bus lines may be precharged to an N-channel logic high voltage precharge level to optimize speed. The logic high voltage of the N-channel transistor is somewhat below a positive power supply voltage, caused by a gate-to-source threshold voltage drop which occurs when the N-channel transistor is coupled between a positive power supply voltage terminal and the bus. It is possible, furthermore, to have buses which couple to two types of circuits; for example, circuits with N-channel transistor output levels and circuits with full CMOS output levels may be coupled to the same bus. The CMOS logic high voltage is virtually equal to the positive power supply voltage, and thus exceeds the precharge level. Having a CMOS output level left on the bus from the previous cycle presents a problem if the N-channel precharge level is desired, and simple precharge circuits no longer suffice.

BRIEF DESCRIPTION OF THE INVENTION

Accordingly, it is an object of the present invention to provide a circuit for precharging a signal line to an N-channel logic high voltage.

It is another object of the present invention to provide a circuit for adjusting a voltage level to a predetermined voltage during a precharge period.

It is still another object of the present invention to provide a method for precharging a voltage on an N-channel bus to improve stability.

In carrying out these and other objects of the invention, there is provided, in one form, a circuit for setting a precharge level on a bus line, comprising a pullup portion, a pulldown portion, and a buffer portion. The pullup portion is coupled to the bus line, and couples the bus line to a first power supply voltage terminal during a precharge period if a voltage on the bus line is less than a predetermined voltage. The pulldown portion is coupled to the bus line and couples the bus line to a second power supply voltage terminal during the precharge period in response to a buffer signal. The buffer portion is coupled to the bus line and to the pulldown portion, and provides the buffer signal if a voltage on the bus line is greater than the predetermined voltage.

These and other objects, features and advantages will be more clearly understood from the following detailed description taken in conjunction with the accompanying drawings.

DETAILED DESCRIPTION OF THE INVENTION

Figure 1:
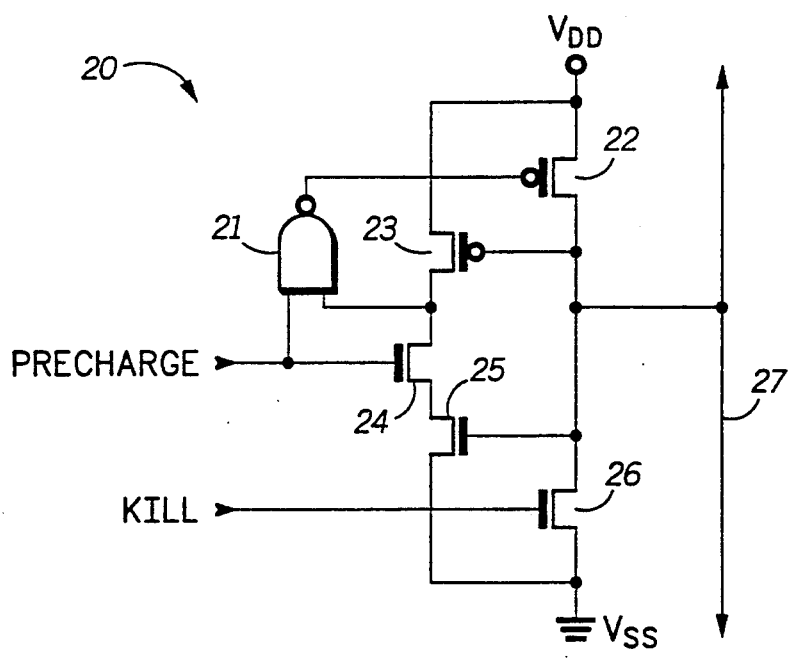
FIG. 1 illustrates in schematic form a precharge circuit according to the prior art.

FIG. 1 illustrates in schematic form a precharge circuit 20 according to the prior art. Circuit 20 comprises a NAND gate 21, P-channel transistors 22 and 23, N-channel transistors 24–26, and a bus line 27. NAND gate 21 has a first input terminal for receiving a signal labelled "PRECHARGE", a second input terminal, and an output terminal. Transistor 22 has a source connected to a positive power supply voltage terminal labelled "$V_{DD}$", a gate connected to the output terminal of NAND gate 21, and a drain connected to bus line 27. Transistor 23 has a source connected to $V_{DD}$, a gate connected to bus line 27, and a drain connected to the second input terminal of NAND gate 21. Transistor 24 has a drain connected to the drain of transistor 23, a gate for receiving PRECHARGE, and a source. Transistor 25 has a drain connected to the source of transistor 24, a gate connected to bus line 27, and a drain connected to a negative power supply voltage terminal labelled "$V_{SS}$". Transistor 25 has a drain connected to bus line 25, a gate for receiving a signal labelled "KILL", and a source connected to $V_{SS}$.

At the beginning of a precharge cycle, signal PRECHARGE, which defines a precharge period before data is driven onto bus line 27, is provided as a logic high. Transistor 24 is conductive, and therefore transistors 23 and 25 form an inverter to invert the level on bus line 27. The function of NAND gate 21 is also simplified when PRECHARGE is a logic high, and NAND gate 21 inverts the logic state on the drain of transistor 23. Therefore, the voltage driven on the gate of transistor 22 is equal to the logic state of the bus, as defined by the voltage switchpoint of the inverter formed by transistors 23 and 25. The relative sizing of transistors 23 and 25 can be chosen to make the inverter have a given voltage switchpoint, corresponding to a predefined precharge voltage level. If the voltage on bus line 25 is below the given precharge voltage, then the voltage of the gate of transistor 22 is a logic low, and transistor 22 is conductive. Transistor 22 couples bus line 27 to $V_{DD}$, and the voltage on bus line 27 rises until it reaches the precharge voltage. At the end of the cycle, after data has been coupled to bus line 25, KILL is asserted, and the voltage of the bus is reduced below the precharge level. While transistor 26 allows circuit 20 to reduce the voltage on the bus which might occur when a device on the bus has a logic high output level higher then the precharge level, circuit 20 is prone to oscillation during the precharge period.

Figure 2:
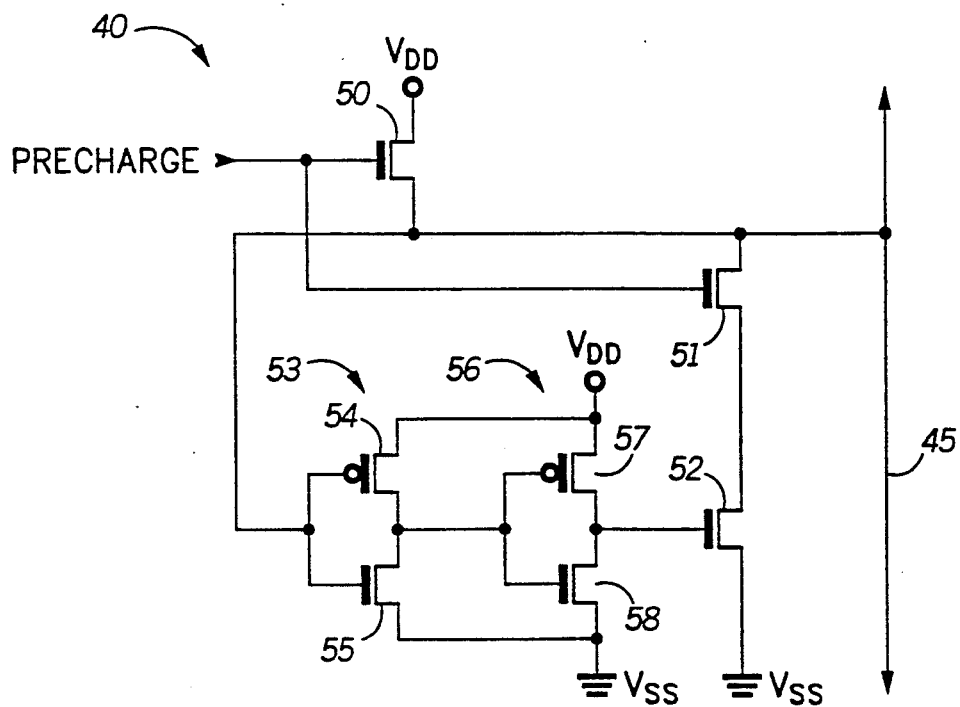
FIG. 2 illustrates in schematic form a self-adjusting precharge level circuit in accordance with the present invention.

FIG. 2 illustrates in schematic form a self-adjusting precharge level circuit 40 in accordance with the present invention. Also shown in FIG. 2 is a bidirectional signal bus line 45 coupled to circuit 40. Circuit 40 comprises an N-channel transistor 50, an N-channel transistor 51, an N-channel transistor 52, an inverter 53, and an inverter 56. Inverter 53 comprises a P-channel transistor 54 and an N-channel transistor 55, and inverter 56 comprises a P-channel transistor 57 and an N-channel transistor 58. Transistor 50 has a drain connected to $V_{DD}$, a gate for receiving a signal labelled "PRECHARGE", and a source connected to bus line 45. Transistor 51 has a drain connected to bus line 45, a gate for receiving PRECHARGE, and a source. Transistor 52 has a drain connected to the source of transistor 51, a gate, and a drain connected to $V_{SS}$. In inverter 53, transistor 54 has a source connected to $V_{DD}$, a gate connected to bus line 45, and a drain. Transistor 55 has a drain connected to the drain of transistor 54, a gate connected to bus line 45, and a source connected to $V_{SS}$. In inverter 56, transistor 57 has a source connected to $V_{DD}$, a gate connected to the drain of transistor 54, and a drain connected to the gate of transistor 52. Transistor 58 has a drain connected to the drain of transistor 57, a gate connected to the drain of transistor 54, and a source connected to $V_{SS}$.

Precharge circuit 40 provides a precharge voltage on bus line 45 during a precharge period. The N-channel precharge level is equal to an N-channel threshold voltage below $V_{DD}$, or $$V_{PC} = V_{DD} - V_{NTH}$$

where $V_{PC}$ is equal to the precharge voltage provided on bus 45, and $V_{NTH}$ is equal to the threshold of an N-channel transistor, in this case transistor 50. Circuit 40 adjusts the voltage on bus line 45 to $V_{PC}$ on bus line 45 during a precharge period. The precharge period occurs when PRECHARGE is a logic high. In a typical environment for circuit 40 bus line 45 is one of several bus lines forming an address or data path of a microprocessor. The signal PRECHARGE is generated in response to a state machine or to microcode preceding a period of time in which a circuit places the address or data signals on the bus. It should be apparent that in other embodiments circuit 40 could be coupled to a single signal line instead of a bus line.

Circuit 40 is self-adjusting not only because it increases the voltage on bus line 45 to $V_{PC}$ after a previous cycle in which a logic low voltage was provided on bus line 45, but also because it decreases the voltage to $V_{PC}$ after a previous cycle in which a CMOS logic high voltage, which exceeds $V_{PC}$, was provided on bus line 45. When the voltage on bus line 45 is below $V_{PC}$ at the start of the precharge period, transistor 50 is conductive and increases the voltage on the source of transistor 50, connected to bus line 45, until this voltage is equal to $V_{NTH}$ below $V_{DD}$, because above that voltage, the gate-to-source voltage of transistor 50 falls below its threshold. Note that the size of transistor 50, the length of the threshold period, and the capacitive loading of bus line 45 determine whether transistor 50 can increase the voltage to $V_{PC}$ by the end of the precharge period. The requirements of speed in relation to the precharge level and the capacitive loading of the bus may be simulated to optimize the size of transistor 50 for a particular application.

Because circuit 40 is self-adjusting and decreases the voltage to $V_{PC}$ if the voltage exceeds $V_{PC}$, circuit 40 allows not only N-channel output circuits to be tied to bus line 45, but also CMOS output circuits, which have a logic high voltage above $V_{PC}$. If during a previous cycle a CMOS output circuit has provided a voltage level on bus line 45 above $V_{PC}$, then circuit 40 decreases the voltage on bus line 45 to $V_{PC}$. The voltage switchpoint of inverter 53, determined by the $\beta$ ratio of transistors 54 and 55, is set substantially equal to $V_{PC}$, where $$\beta = (W_{54}/L_{54})/(W_{55}/L_{55})$$

and where $W_{54}$ is the gate width of transistor 54, $L_{54}$ is the gate length of transistor 54, $W_{55}$ is the gate width of transistor 55, and $L_{55}$ is the gate length of transistor 55.

If the voltage on bus line 45 is greater than $V_{PC}$, then inverter 53 recognizes a logic high, and drives a logic low voltage on the input terminal of inverter 56. Inverter 56 then provides a logic high voltage on the gate of transistor 52, and since transistors 51 and 52 are both conductive, bus line 45 is coupled to $V_{SS}$. Thus circuit 40 starts to decrease the voltage on bus line 45. When the voltage on bus line 45 falls below $V_{PC}$, inverter 53 recognizes a logic low voltage, inverter 56 a logic high voltage, and transistor 52 is made nonconductive. Therefore, no matter what the initial voltage on bus line 45, the voltage approaches at $V_{PC}$.

An important feature of circuit 40 is that the dynamic response characteristic is dampened and the oscillation of voltage on circuit 40 is suppressed. When the voltage rises above $V_{PC}$, transistor 50 becomes immediately nonconductive, but there is a time delay until transistors 51 and 52 become conductive due to the delay introduced by inverters 53 and 56. Also when the voltage on bus line 45 falls below $V_{PC}$, transistor 50 becomes conductive immediately but transistors 51 and 52 do not become nonconductive until the voltage on bus line 45 propagates through inverters 53 and 56. These delays dampen the response of circuit 40 and suppress oscillation. To support a dampened voltage response, the $\beta$ ratio of transistor pairs in inverters 53 and 56 can be controlled. The voltage switchpoint of inverter 53 is controlled by the relative gate width to gate length ratios of transistors 54 and 55. In the illustrated embodiment, in which $V_{PC}$ is equal to $(V_{DD} - V_{NTH})$, transistor 54 must be sized much larger than transistor 55. Transistors 57 and 58 should be sized in an inverse $\beta$ ratio to transistors 54 and 55.

It should be apparent by now that a self-adjusting precharge level circuit for connecting to a bus line or other signal line has been described. In the illustrated embodiment the circuit is connected to an N-channel precharged bus which has both N-channel pulldown transistors and full CMOS output drivers connected to it. The precharge level is one N-channel transistor threshold voltage below a positive power supply voltage, and this level optimizes speed and power considerations for the illustrated embodiment. When the precharge period begins, the circuit adjusts the voltage automatically to $V_{PC}$, whether the initial voltage is above or below $V_{PC}$. The adjusting is such that the voltage response of the bus line is dampened and resists oscillation.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A circuit for setting a precharge level on a bus line, comprising:
   - a first transistor having a first current electrode coupled to a first power supply voltage terminal, a control electrode for receiving a precharge signal, and a second current electrode coupled to the bus line;
   - a second transistor having a first current electrode coupled to the bus line, a control electrode for receiving said precharge signal, and a second current electrode;
   - a third transistor having a first current electrode coupled to said second current electrode of said second transistor, a control electrode, and a second current electrode coupled to a second power supply voltage terminal;
   - buffer means coupled to the bus line and to said control electrode of said third transistor, for making said third transistor conductive in response to a voltage on said bus line exceeding a predetermined voltage level, and comprising:
     - a fourth transistor having a first current electrode coupled to said first power supply voltage terminal, a control electrode coupled to the bus line, and a second current electrode;
     - a fifth transistor having a first current electrode coupled to said second current electrode of said fourth transistor, a control electrode coupled to the bus line, and a second current electrode coupled to said second power supply voltage terminal;
     - a sixth transistor having a first current electrode coupled to said first power supply voltage terminal, a control electrode coupled to said second current electrode of said fourth transistor, and a second current electrode coupled to said control electrode of said third transistor; and
     - a seventh transistor having a first current electrode coupled to said second current electrode of said sixth transistor, a control electrode coupled said second current electrode of said fourth transistor, and a second current electrode coupled to said second power supply voltage terminal.

2. The circuit of claim 1 wherein a gate width to gate length ratio of said fourth transistor divided by a gate width to gate length ratio of said fifth transistor, is substantially equal to a gate width to gate length ratio of said seventh transistor divided by a gate width to gate length ratio of said sixth transistor.

3. A circuit for setting a precharge level on a bus line, comprising:
   - a first transistor having a first current electrode coupled to a first power supply voltage terminal, a control electrode for receiving a precharge signal, and a second current electrode coupled to the bus line;
   - a second transistor having a first current electrode coupled to the bus line, a control electrode for receiving said precharge signal, and a second current electrode;
   - a third transistor having a first current electrode coupled to said second current electrode of said second transistor, a control electrode, and a second current electrode coupled to a second power supply voltage terminal;
   - a fourth transistor having a first current electrode coupled to said first power supply voltage terminal, a control electrode coupled to the bus line, and a second current electrode;
   - a fifth transistor having a first current electrode coupled to said second current electrode of said fourth transistor, a control electrode coupled to the bus line, and a second current electrode coupled to said second power supply voltage terminal;
   - a sixth transistor having a first current electrode coupled to said first power supply voltage terminal, a control electrode coupled to said second current electrode of said fourth transistor, and a second current electrode coupled to said control electrode of said third transistor; and
   - a seventh transistor having a first current electrode coupled to said second current electrode of said sixth transistor, a control electrode coupled said second current electrode of said fourth transistor, and a second current electrode coupled to said second power supply voltage terminal.

4. The circuit of claim 3 wherein a gate width to gate length ratio of said fourth transistor divided by a gate width to gate length ratio of said fifth transistor, is substantially equal to a gate width to gate length ratio of said seventh transistor divided by a gate width to gate length ratio of said sixth transistor.

* * * * *